United States Patent [19]

Mitsutsuka et al.

[11] Patent Number: 4,757,226
[45] Date of Patent: Jul. 12, 1988

[54] SURFACE ACOUSTIC WAVE CONVOLVER

[75] Inventors: Syuichi Mitsutsuka; Shoichi Minagawa, both of Tokyo, Japan

[73] Assignee: Clarion Co., Ltd., Tokyo, Japan

[21] Appl. No.: 89,498

[22] Filed: Aug. 25, 1987

[30] Foreign Application Priority Data

Sep. 2, 1986 [JP] Japan ................................. 61-207457

[51] Int. Cl.4 ........................................... H01L 41/08
[52] U.S. Cl. ............................. 310/313 A; 310/313 R; 333/152; 364/821
[58] Field of Search ........... 310/313 R, 313 A, 313 B, 310/313 C, 313 D; 333/150-155, 193-196; 364/819, 821, 825, 604

[56] References Cited

U.S. PATENT DOCUMENTS

| | | | |
|---|---|---|---|
| 4,101,965 | 7/1978 | Ingebrigtsen et al. | 310/313 R |
| 4,471,255 | 9/1984 | Mikoshiba et al. | 310/313 R |
| 4,600,853 | 7/1986 | Whitlock et al. | 310/313 B |
| 4,611,140 | 9/1986 | Whitlock et al. | 310/313 R X |
| 4,683,395 | 7/1987 | Mitsutka | 310/313 R |

Primary Examiner—Mark O. Budd
Attorney, Agent, or Firm—Flynn, Thiel Boutell & Tanis

[57] ABSTRACT

A monolithic SAW convolver comprises a piezoelectric film, an insulator, a semiconductive epitaxial film and a high-concentrated semiconductive substrate. The semiconductive epitaxial film has a thickness in a predetermined range to improve the efficiency and the temperature property of the convolver.

18 Claims, 12 Drawing Sheets

SURFACE ACOUSTIC WAVE CONVOLVER

FIELD OF THE INVENTION

This invention relates to an arrangement of a monolithic surface acoustic wave convolver (hereinafter called "SAW convolver") consisting of a piezoelectric film and a semiconductor.

BACKGROUND OF THE INVENTION

FIGS. 14 and 15 are cross-sectional views of two different prior art monolithic convolvers in which reference numeral 1 refers to a high-concentration semiconductor substrate, 2 to an insulator, 3 to a piezoelectric film, 4 and 4' to inputs, 5 and 5' to comb-shaped electrodes, 6 to an output, 7 to a back electrode, 8 to a gate electrode, and 9 to a semiconductive epitaxial film.

Arrangements of FIGS. 14 and 15 are different in semiconductor structure. In FIG. 14, a bulk semiconductor substrate is used as the semiconductor, whereas the arrangement of FIG. 15 uses a substrate made by growing a semiconductive epitaxial film on a high-concentrated semiconductor substrate (a substrate having a high impurity density). Various properties of these arrangements are reported in the following publications.

Document [1], B. T. Khuri—Yakub and G. S. Kino, "A Detailed Theory of the Monolithic Zinc Oxide on Silicon Convolver", IEEE Trans. Sonics Ultrason., vol. SU - 24, No. 1, January 1977, pp. 34–43

Document [2], J. K. Elliott, et al. "A Wideband SAW convolver utilizing Sezawa waves in the metal—ZnO—SiO$_2$—Si configuration", Appl. Phys. Lett. 32, May 1978, pp. 515–516

Document [3], J. E. Bowers, et al. "Monolithic Sezawa wave Storage Correlators and Convolvers", IEEE Proc. Ultrasonics Symposium, 1980, pp. 118–123

Document [4], S. Minagawa, et al. "Efficient ZnO—SiO$_2$—Si Sezawa wave convolver", IEEE Trans. Sonics Ultrason., vol. SU - 32, No. 5, September 1985, pp. 670–674

Documents [1], [2] and [3] report properties of the convolver of FIG. 14, and Document [4] reports properties of the convolver of FIG. 15.

As will be understood from comparison of these reports, the arrangement of FIG. 15 tends to exhibit a higher value than that of FIG. 14. In this respect, the use of a substrate including an epitaxial film as shown in FIG. 15 is more advantageous as a convolver. However, no theoretical or experimental detailed discussion has been made heretofore. Therefore, no definite data exists heretofore about the best condition of such an epitaxial layer, and no convolver having the best arrangement is not provided heretofore.

OBJECT OF THE INVENTION

It is therefore an object of the invention to provide a SAW convolver having the best arrangement considering a result of detailed analyzation of effects of a semiconductive epitaxial film.

More specifically, the invention provides a convolver having the best relationship between the thickness and the impurity density of the semiconductive epitaxial film in the arrangement of FIG. 15.

SUMMARY OF THE INVENTION

According to the invention, there is provided a monolithic convolver comprising a high-concentrated semiconductor substrate, a semiconductive epitaxial film grown on a surface of said semiconductor substrate, an insulator provided on said epitaxial film and a piezoelectric film provided on said insulator, said semiconductive epitaxial layer having a thickness L satisfying the following relationship:

$$W_{max} < L \leq W_{max} + 2 \ \mu m$$

where $W_{max}$ is the maximum depletion width expressed by:

$$W_{max} = \sqrt{\frac{4\epsilon_s kT\ln(N/n_1)}{e^2 N}}$$

where N is the impurity density of the epitaxial film, ni is the intrinsic carrier density of the epitaxial film, $\epsilon_s$ is the dielectric constant of the epitaxial film, k is the Boltsmann's constant, e is the electron charge, and T is the absolute temperature.

Preferably, the semiconductor is made from silicon (Si), and impurity density N is in the following range:

$$1 \times 10^{13} cm^{-3} \leq N \leq 1 \times 10^{16} cm^{-3}$$

When a monolithic SAW convolver comprises a high-concentrated semiconductor substrate, a first semiconductive film on the substrate, a second semiconductive film on the first semiconductive film, an insulator on the second semiconductive film and a piezoelectric film, the first and second semiconductive films are semiconductive epitaxial films having opposite conduction types, and the total thickness of the semiconductive epitaxial films is in the following range:

$$l_2 < L \leq l_2 + W_m + 2 \ \mu m$$

where $l_2$ is the thickness of the second semiconductive film, and $W_m$ is expressed by:

$$W_m = \sqrt{\frac{4\epsilon_s kT\ln(N_1/n_1)}{e^2 N_1}}$$

where $N_l$ is the impurity density of the first semiconductive film, ni is the intrinsic carrier density of the first semiconductive film, $\epsilon_s$ is the dielectric constant of the first semiconductive film, k is the Boltsmann's constant, e is the magnitude of electron charges, and T is the absolute temperature.

Preferably, the semiconductor is made from silicon (Si), and impurity density $N_l$ of the epitaxial films is in the following range:

$$1 \times 10^{13} cm^{-3} \leq N_l \leq 1 \times 10^{16} cm^{-3}$$

The semiconductor may be made from GaAs. The insulator may be omitted substantially, or alternatively, it may be made from SiO$_2$. The piezoelectric film is made from ZnO or AlN, and Sezawa wave is preferred as a propagation mode of surface acoustic waves.

Surface orientation of Si is (110), with propagation direction [100] of surface acoustic waves. Alternatively, surface orientation of Si is (100), with propagation direction [110] of surface acoustic waves.

FIG. 1 shows in an enlarged view an arrangement under the gate electrode of FIG. 15. In FIG. 1, reference numerals common to FIG. 15 denote identical or corresponding members. Reference numeral 10 refers to a depletion end, 11 to the maximum depletion end, Nd to the donor density of the epitaxial film, Na to the acceptor density of the epitaxial film, L to the thickness of the epitaxial film, $W_{max}$ to the maximum depletion width, W to the depletion width, h to the thickness of the piezoelectric film, f to the frequency of a surface acoustic wave (SAW), λ to the wavelength of the SAW, and $V_B$ to a bias voltage. In this arrangement, thickness N and impurity concentration N of the semiconductive epitaxial film are fixed as follows.

(A) Thickness L of the semiconductive epitaxial film is determined to the following value with respect to the maximum depletion width $W_{max}$ which is determined by the impurity density of the epitaxial film (donor density in an n-type semiconductor and acceptor density in a p-type semiconductor).

$$W_{max} < L \leq W_{max} + 2 \ \mu m \tag{1}$$

where $W_{max}$ is the maximum depletion width at the room temperature (23° C.), and the values of L and $W_{max}$ are represented in μm.

$W_{max}$ is expressed by:

$$W_{max} = \sqrt{\frac{4\epsilon_s kT\ln(N/n_1)}{e^2 N}} \tag{2}$$

where N is the impurity density of the epitaxial film which equals donor density Nd if the epitaxial film is an n-type semiconductor, or equals acceptor density Na if the epitaxial film is a p-type semiconductor. T is the absolute temperature indicated below:

$$T = 296 \ (K) \tag{3}$$

$n_i$ is the intrinsic carrier density of the semiconductive layer, $\epsilon_s$ is the dielectric constant of the semiconductive layer, k is the Boltsmann's constant, and e is electron charges.

Particularly, when silicon (Si) is used as the semiconductor, the impurity density is preferably selected as follows in addition to the condition of the thickness of the epitaxial film.

(B) If the semiconductor is made from Si, thickness L of the epitaxial film is selected to satisfy expression (1), and impurity density N is selected in the following range:

$$1 \times 10^{13} cm^{-3} \leq N \leq 1 \times 10^{16} cm^{-3} \tag{4}$$

As a reference only, FIG. 2 shows the relationship between maximum depletion width Wmax of Si and impurity density Nd. In the illustration, n-type Si is shown. However, using a p-type Si, the identical relationship is established except that the donor density is replaced by the acceptor density. From FIG. 2 and expression (1), some preferable values of the thickness of the epitaxial film are as follows:

$$2.4 \ \mu m < L \leq 4.4 \ \mu m$$

when $N = 1 \times 10^{14} cm^{-3}$ $$0.9 \ \mu m < L \leq 2.9 \ \mu m$$

when $N = 1 \times 10^{15} cm^{-3}$.

The invention selects conditions of the epitaxial film of FIG. 15 as described in (A) and (B) above for the following reasons.

$F_T$ (convolution efficiency) of the convolver is expressed by:

$$F_T = 20 \log \gamma_2 - 10 \log R_B - aL_g - 30 + L_e \quad \text{(5) ps}$$

where $\gamma_2$ is the non-linear efficiency, $R_B$ is the output resistance of the gate portion of the convolver, α is the propagation loss of SAW, and Lg is the gate length. Le is a term fixed irrespectively of the condition of the epitaxial film, and is subject to influences of the electromechanical coupling coefficient, transducer loss, thickness and dielectric constant of the piezoelectric film, frequency and wavelength of a SAW, etc. Since Le is independent of effects of the thickness of the epitaxial film, its expression or equation is omitted here. $F_T$(dBm) is defined as follows with respect to two inputs $Pi_1$ and $Pi_2$ and an output $P_0$:

$$F_T = P_0 - P_{i1} - P_{i2}$$
$(P_{i1}, P_{i2}$ and $P_0$ in μm)

Non-linear constant $\gamma_2$ has the following relationship with impurity density N of the epitaxial film when the semiconductor surface of the convolver is in a depletion condition or in an inverted condition:

$$\gamma_2 \propto \frac{1}{N} \tag{6}$$

$F_T$ exhibits a large value when the semiconductor surface is in a depletion or weak-inverted condition. Therefore, it may be considered that expression (6) is established in activation of the convolver. However, expression (6) is valid only when thickness L of the epitaxial film is larger than depletion width W. If L<W, the depletion end becomes continuous (punch-through) with the interface between the epitaxial film and the high-concentrated semiconductive substrate, and this obviously prevents the depletion end from vibration. In this case, non-linear constant $\gamma_2$ drops rapidly, and it cannot be expressed by expression (6). In response to a drop of $\gamma_2$, $F_T$ also drops largely due to the relationship of expression (5). Therefore, the following relationship is required for the thickness of the epitaxial film:

$$W < L \tag{7}$$

Depletion width W changes with bias voltage $V_B$ applied to the gate electrode, but does not exceed maximum depletion width $W_{max}$ as shown in FIG. 1. Therefore, expression (7) is not practically valid unless thickness L of the epitaxial film is larger than maximum depletion width as follows:

$$W_{max} < L \tag{8}$$

This is one of the reasons for definition of the lower limit of expression (1).

The next description explains a reason why the upper limit of thickness L of the epitaxial film is defined as expression (1).

When L satisfies expression (8), non-linear constant $\gamma_2$ is expressed by expression (6) and becomes independent of thickness L of the epitaxial film. Therefore, elements giving $F_T$ effects of thickness L of the epitaxial film are terms of output resistance $R_B$ and SAW propagation loss in expression (5). From expression (5), the following relationships are recognized:

(i) $F_T$ increases with decrease of $R_B$.
(ii) $F_T$ increases with decrease of the propagation loss.

In respect of the result in (i) above, $R_B$ can be decreased in the use of a semiconductive epitaxial substrate as shown in FIG. 15 more than in the use of a semiconductor bulk substrate as shown in FIG. 14. This is because the resistance of the high-concentrated semiconductive substrate under the epitaxial film is significantly small. Therefore, in this respect, the use of the epitaxial substrate is more advantageous than the use of the bulk substrate. This result is also suggested by documents [1] and [4]. However, practically, the resistance of the epitaxial film, if having a thickness below a certain value, gives almost no influence against $F_T$. Table 1 shows numerical data of $\Delta F_T$ calculated by expression (5) when using an n-type Si and selecting the thickness of the epitaxial film as follows:

TABLE 1

| Donor Density $N_d$ (cm$^{-3}$) | $R_B(\Omega)$ $L = W_{max}$ ① | $R_B(\Omega)$ $L = W_{max} + 2 \mu m$ ② | Difference of $F_T$ between ① and ② $\Delta F_T$(dB) |
|---|---|---|---|
| $2 \times 10^{-13}$ | 1.390 | 1.271 | 0.88 |
| $2 \times 10^{-14}$ | 1.005 | 1.028 | 0.098 |
| $2 \times 10^{-14}$ | 1.003 | 1.005 | 0.009 |

In this case, the gate width is 1 mm, the gate length is 20 mm, and the sum of the resistance of the high-concentrated semiconductive substrate, the resistance of a bonding wire and the ohmic resistance is 1$\Omega$. Further, $\Delta F_T$ results from calculation of influences of term $R_B$ in expression (5). However, as will be described later, it is observed the practical $F_T$ changes by several dB or more with small change about 2 $\mu$m of the thickness of the epitaxial film. Therefore, among effects of the thickness of the epitaxial film, propagation loss $\alpha$ gives $F_T$ a larger influence than $R_B$ does.

The inventors carefully analyzed dependency of propagation loss $\alpha$ on the thickness of the epitaxial film, and found that the influence of the dependency against $F_T$ is remarkable and found a desirable condition regarding the thickness of the epitaxial film. Such a dependency of the propagation loss upon the thickness of the epitaxial film is not known heretofore, and the condition of the thickness of the epitaxial film based on the dependency is provided for the first time by the present invention.

DETAILED DESCRIPTION

Figure 1:
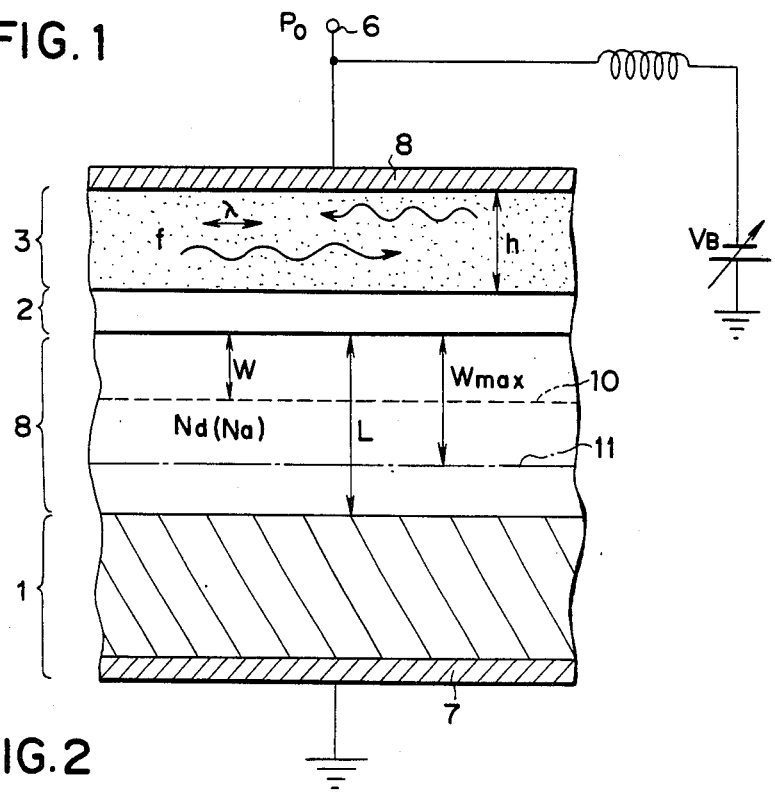
FIG. 1 is a diagrammatic cross-sectional view of a monolithic saw convolver for explanation of the invention.
Figure 2:
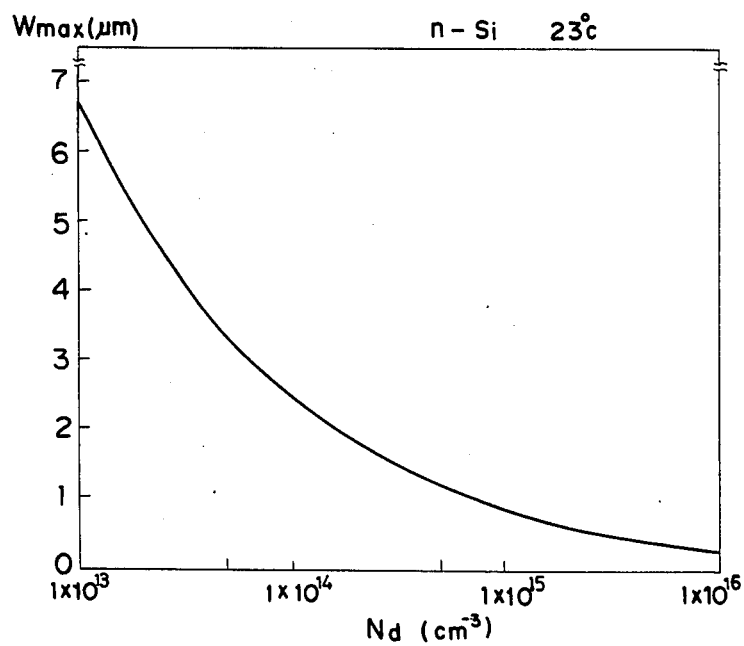
FIG. 2 is a graph showing the relationship between the donor density and the maximum depletion width.

The invention is described below in detail, referring to preferred embodiments illustrated in the drawings.

Figure 3:
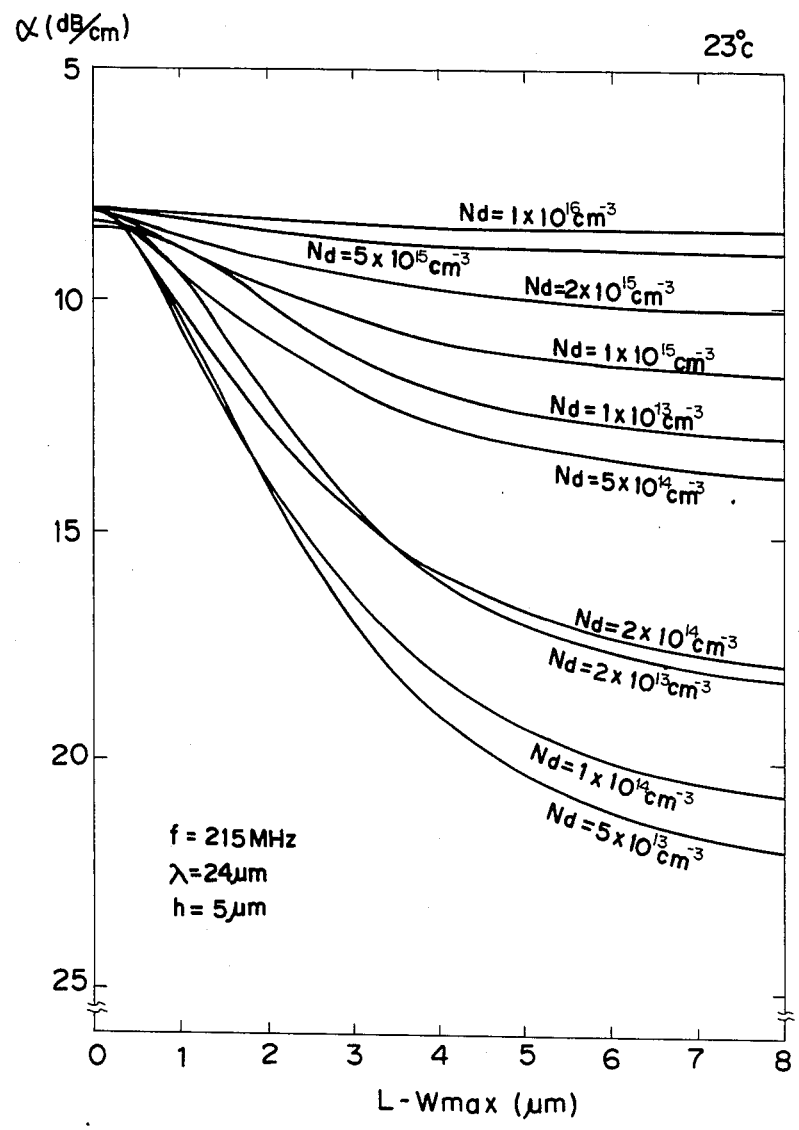
FIG. 3 is a graph showing the relationship between the maximum depletion width and the propagation loss.

FIG. 3 shows an example of the dependency of a SAW propagation loss upon the thickness of the epitaxial film which SAW propagate along a convolver having ZnO/SiO$_2$/n-Si arrangement. The abscissa show the difference between the thickness of the epitaxial film and the maximum depletion width, and the ordinate shows the propagation loss (dB/cm). This example is based on conditions: SAW frequency f=215 MHz, SAW wavelength $\lambda$=24 $\mu$m, thickness h of piezoelectric film (ZnO)=5 $\mu$m, using Sezawa wave as a SAW propagation mode.

Nd is the donor density. The propagation loss is a value corresponding to a bias voltage $V_B$ applied to the gate electrode to maximize $F_T$. As shown in the drawing, the propagation loss is not only influenced by the impurity density but also largely influenced by the thickness of the epitaxial film. The propagation loss increases with increase of the thickness of the epitaxial film, and it sometimes changes by several dB/cm or more with a change of 2 $\mu$m or so of the thickness of the epitaxial film. Comparing this with the value of Table 1, is it recognized that regarding changes of the thickness of the epitaxial film of $F_T$, the propagation loss gives a more significant influence than the output resistance within this range of the thickness of the epitaxial film.

In this connection, carefully considering the aforegoing influences of the propagation loss, changes of $F_T$ are measured under various conditions, and the best condition of the epitaxial film is obtained. Its results are shown in graphs in FIGS. 4 through 12. Either graph is based on ZeO/SiO$_2$/n-Si arrangement. In the graphs, f is the frequency of a SAW, $\lambda$ is the wavelength of the SAW, h is the thickness of ZnO film, Nd is the donor density, and Na is the acceptor density. The thickness of SiO$_2$ film is 0.1 $\mu$m.

FIGS. 4 through 12 show the following relationships.

Figure 4:
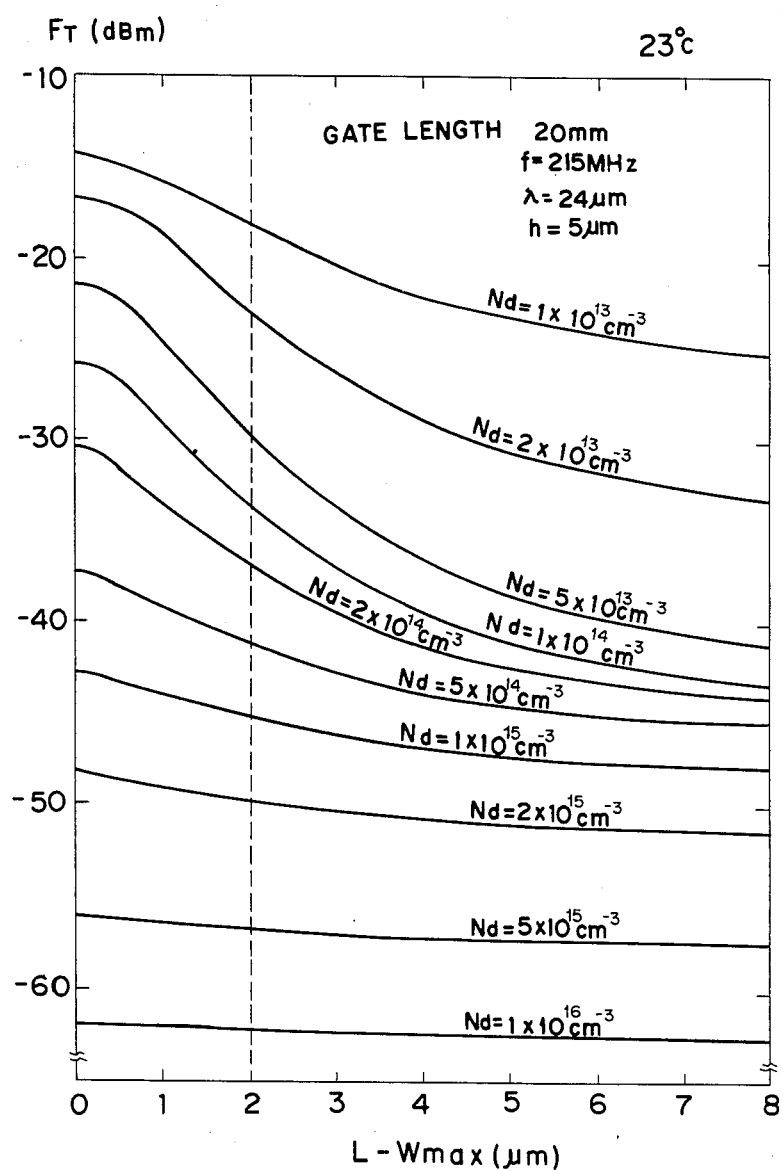
FIGS. 4 through 12 are characteristic graphs of a monolithic saw according to the invention.

FIG. 4: Relationship between the epitaxial film thickness and $F_T$ under conditions: f=215 MHz, Sezawa wave, n-type semiconductor, gate length 20 mm, temperature 23° C.

Figure 5:
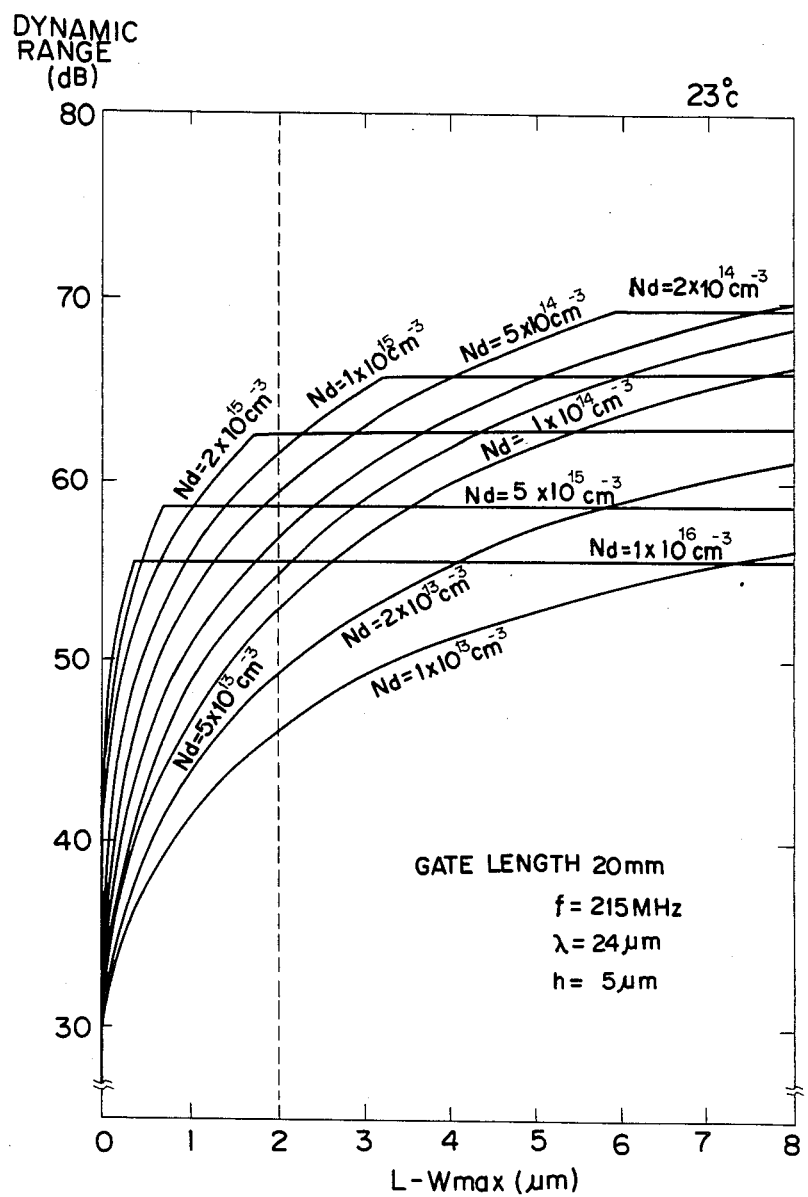

FIG. 5: Relationship between the epitaxial film thickness and the dynamic range under conditions: f=215 MHz, Sezawa wave, n-type semiconductor, gate length 23 mm, temperature 23° C.

Figure 6:
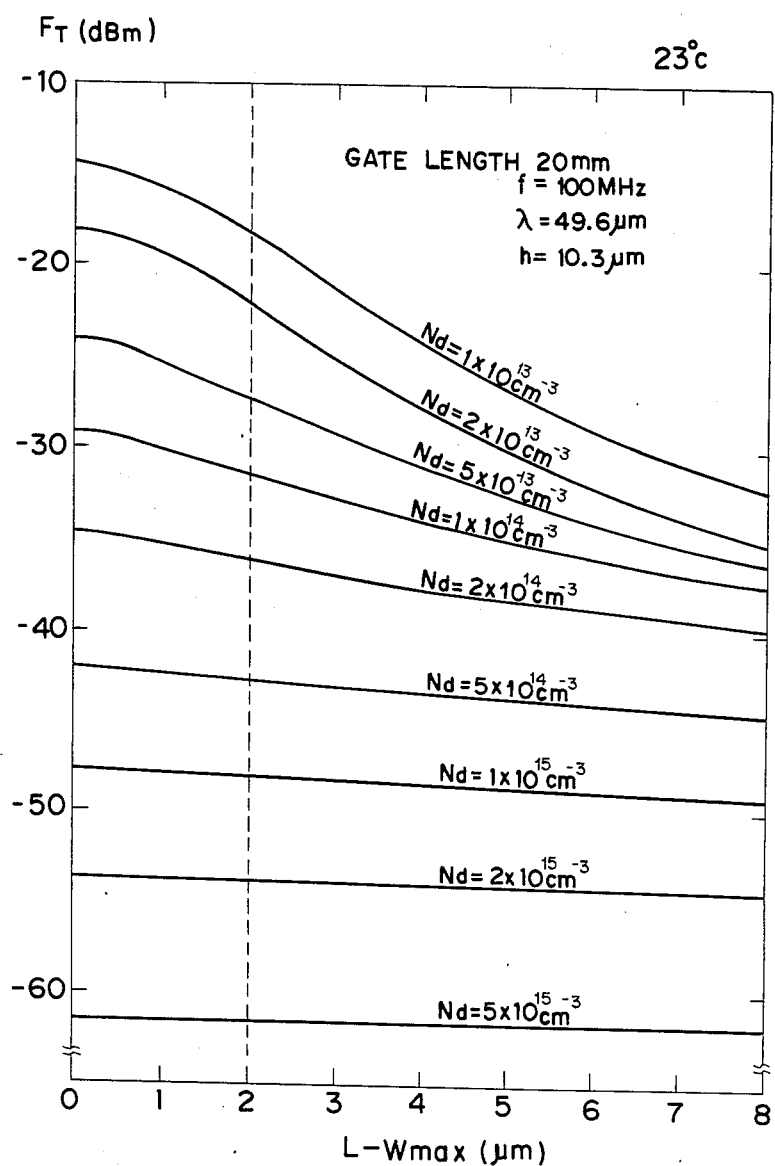

FIG. 6: Relationship between the epitaxial film thickness and $F_T$ under conditions: f=100 MHz, Sezawa wave, n-type semiconductor, gate length 20 mm, temperature 23° C.

Figure 7:
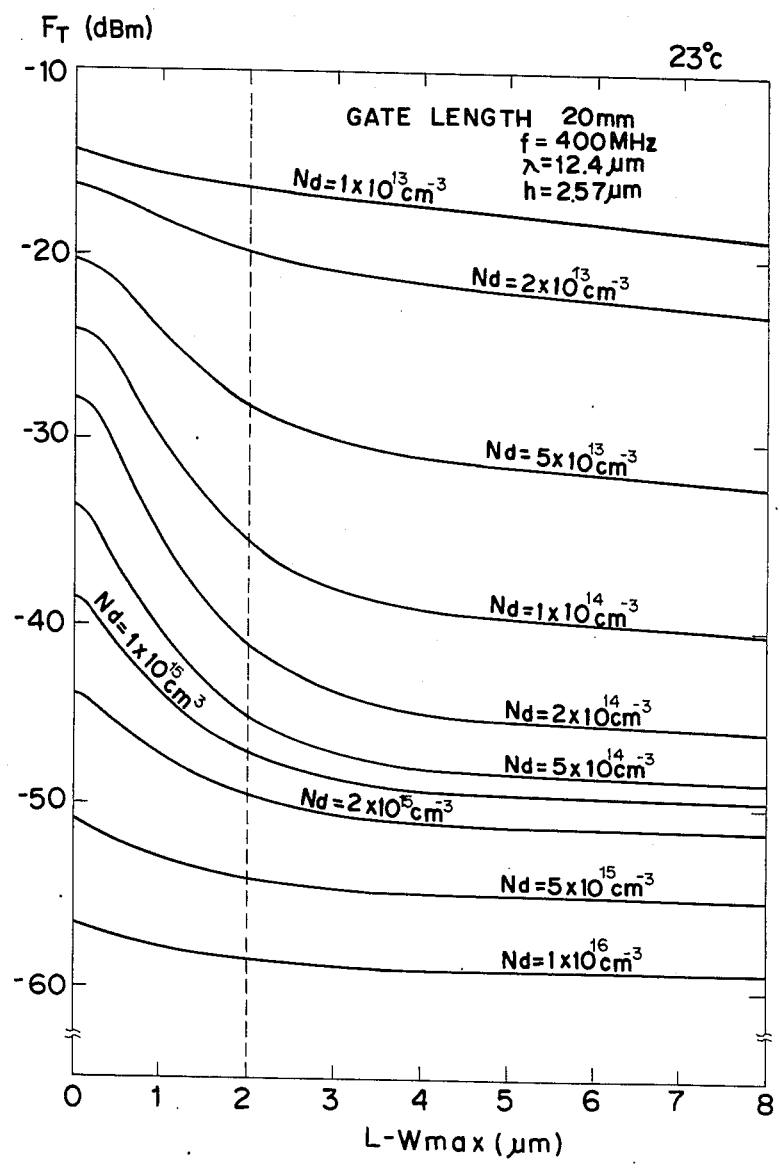

FIG. 7: Relationship between the epitaxial film thickness and $F_T$ under conditions: f=400 MHz, Sezawa wave, n-type semiconductor, gate length 20 mm, temperature 23° C.

Figure 8:
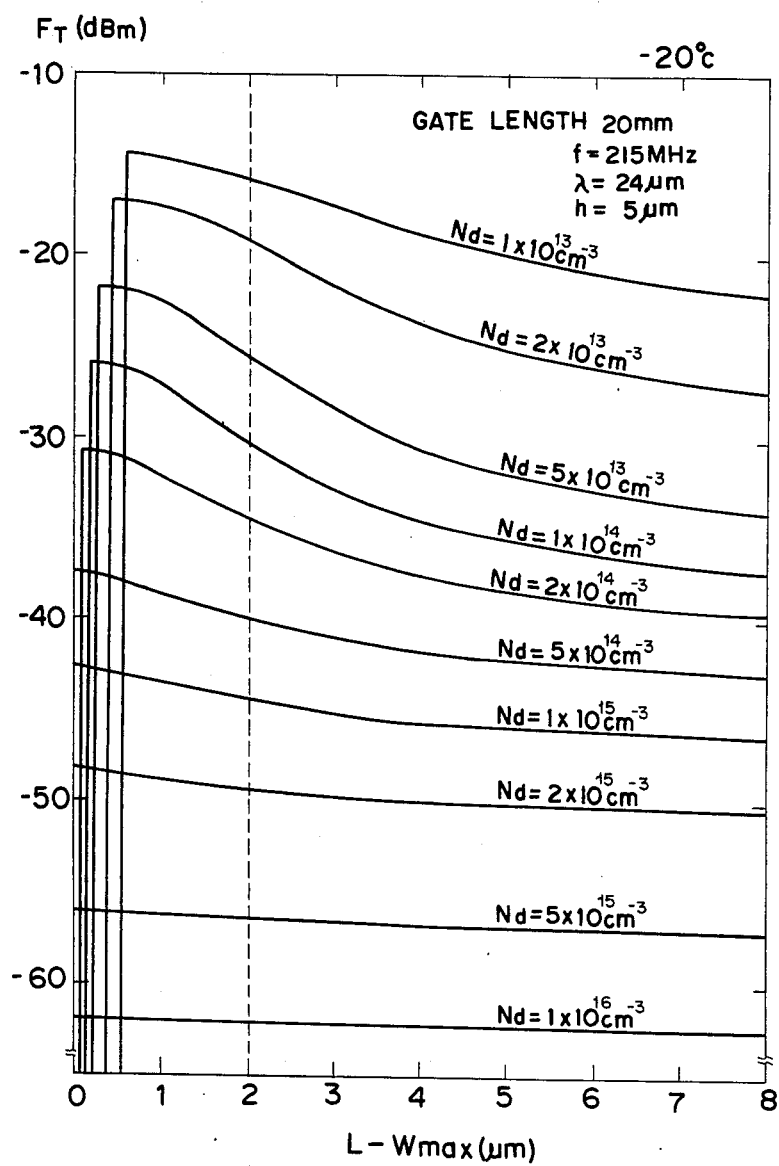

FIG. 8: Relationship between the epitaxial film thickness and $F_T$ under conditions: f=215 MHz, Sezawa wave, n-type semiconductor, gate length 20 mm, temperature −20° C.

Figure 9:
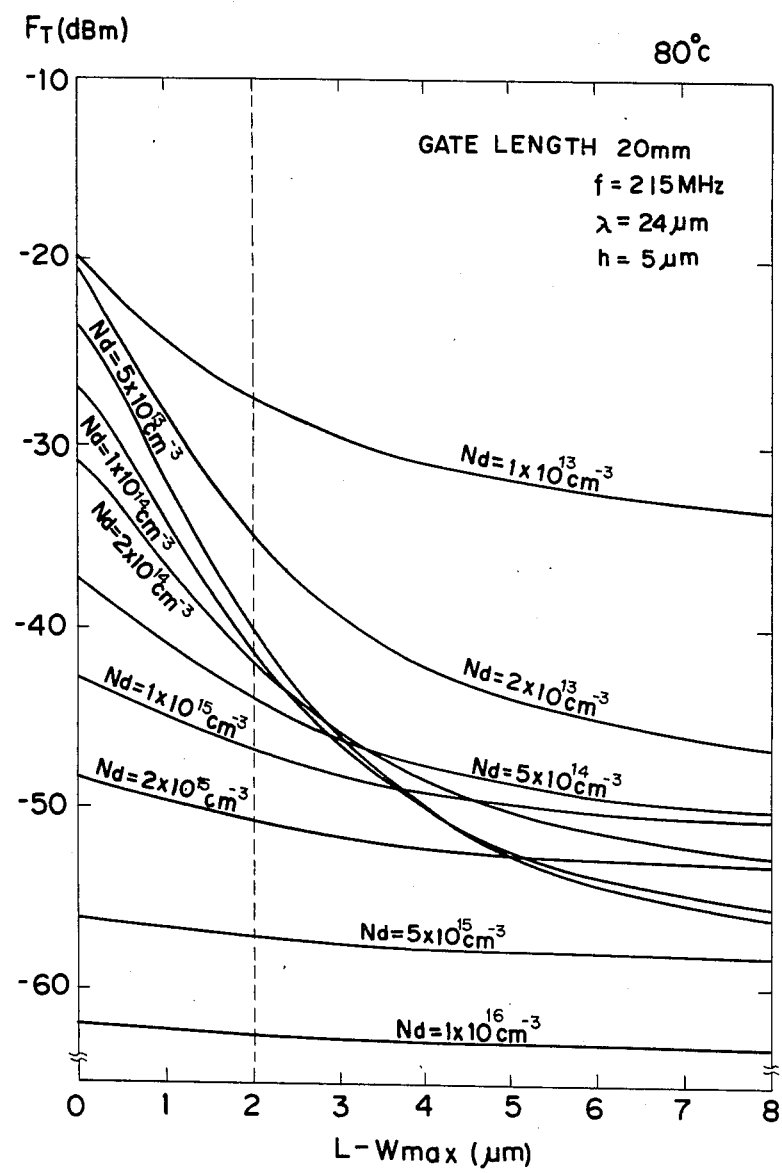

FIG. 9: Relationship between the epitaxial film thickness and $F_T$ under conditions: f=215 MHz, Sezawa wave, n-type semiconductor, gate length 20 mm, temperature −80° C.

Figure 10:
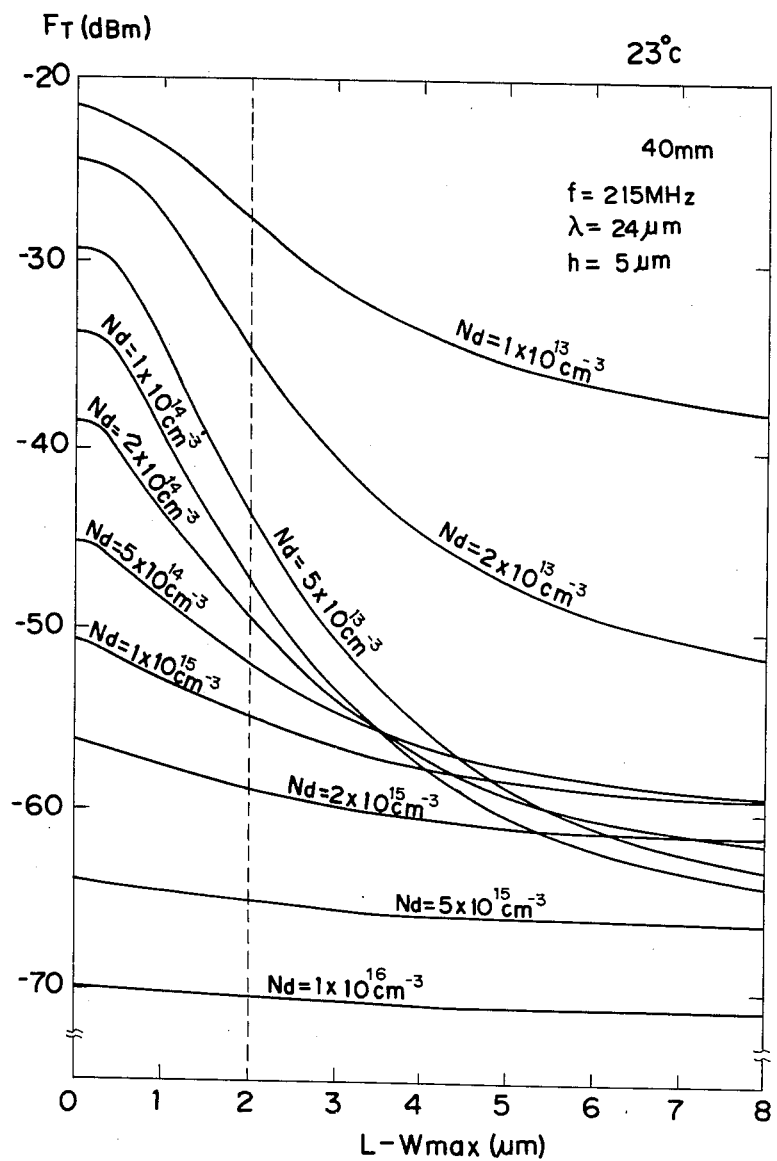

FIG. 10: Relationship between the epitaxial film thickness and $F_T$ under conditions: f=215 MHz, Sezawa wave, n-type semiconductor, gate length 40 mm, temperature 23° C.

Figure 11:
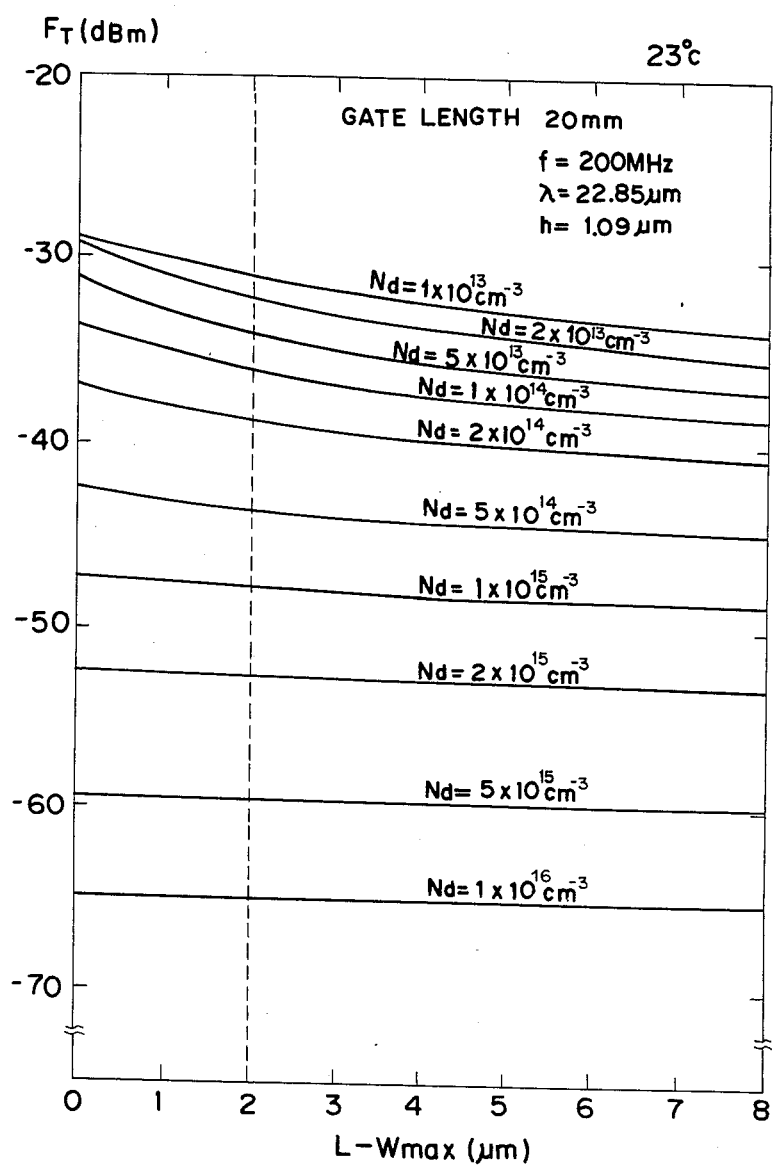

FIG. 11: Relationship between the epitaxial film thickness and $F_T$ under conditions: f=200 MHz, Rayleigh wave, n-type semiconductor, gate length 20 mm, temperature 23° C.

Figure 12:
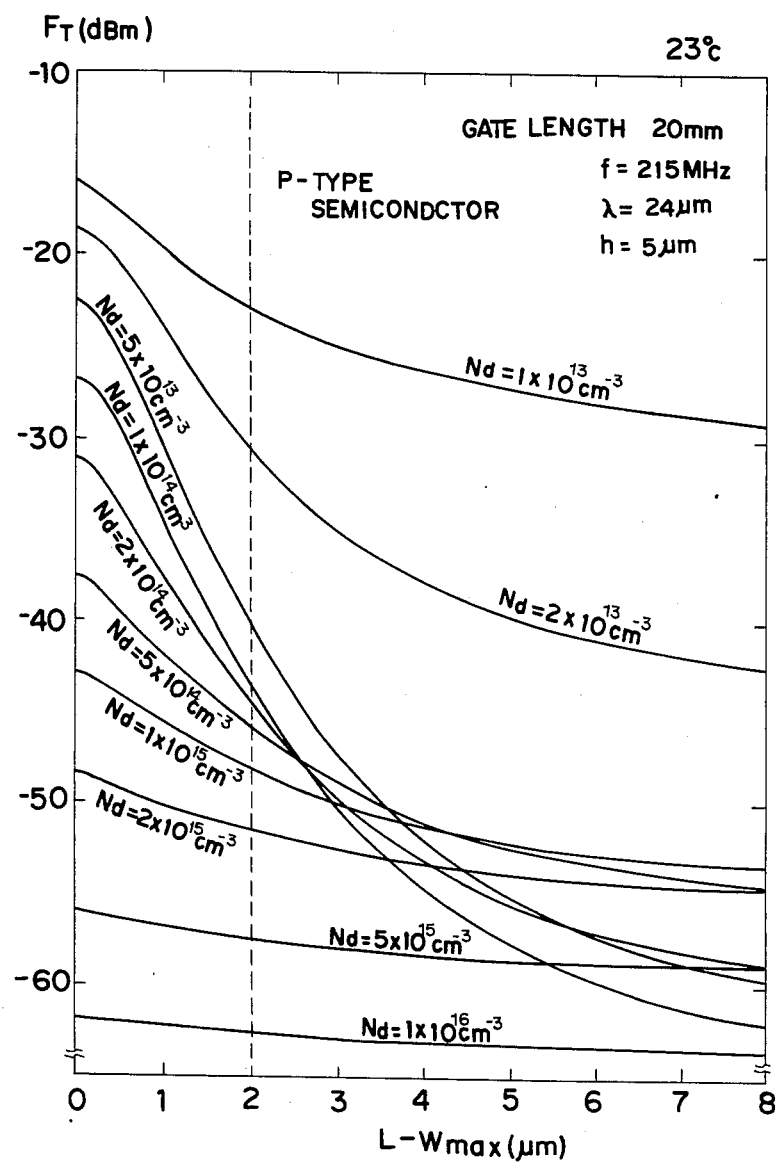

FIG. 12: Relationship between the epitaxial film thickness and $F_T$ under conditions: f=215 MHz, Sezawa wave, p-type semiconductor, gate length 20 mm, temperature 23° C.

In each drawing, the abscissa shows the difference between the epitaxial film thickness and the maximum depletion width at the room temperature (23° C.). The value of $F_T$ corresponds to a bias voltage applied to the gate electrode to maximize $F_T$.

From FIGS. 4 through 12, it is recognized that $F_T$ is influenced remarkably by the epitaxial film thickness, and that $F_T$ decreases with increase of the epitaxial film thickness. In this respect, a qualitatively similar tendency is seen in different SAW frequencies (FIGS. 4, 6 and 7), in different temperatures (FIGS. 4, 8 and 9), in different gate lengths (FIGS. 4 and 10), in different SAW propagation modes (FIGS. 4 and 11), and in different semiconductor conductivity types (FIG. 12). Quantitatively, influences of the epitaxial film thickness are remarkable when the gate is long.

It appears from these results that the epitaxial film thickness had better be thin as far as possible in order to increase $F_T$. However, as shown in FIG. 5, $F_T$ sometimes drops rapidly at a low temperature if the epitaxial film is so thin. This is because the depletion width tends to expand wider at a low temperature than it does at the normal temperature, and the depletion end becomes continuous (punch-through) with the interface of the epitaxial film and the high-concentrated semiconductive substrate and is prevented from vibration. These factors are another reason why the condition of expression (8) is required. Therefore, the epitaxial film has to be thicker to a certain extent than the maximum depletion width. Additionally, the thickness of the epitaxial film must not invite a large decrease of $F_T$.

The invention selects such a suitable thickness L of the epitaxial film within 2 μm over maximum depletion width $W_{max}$.

$$L \leq W_{max} + 2 \; \mu m \tag{9}$$

This is because $F_T$ possibly drops by 10 dB or more below the maximum value if $L > W_{max} + 2$ μm in FIGS. 4 through 12. Also regarding the temperature property, it is recognized from comparison between FIGS. 8 and 9 that $F_T$ changes largely with temperature if $L > W_{max} + 2$ μm. In this respect also, the condition of expression (9) is reasonable. From FIG. 5, since the dynamic range has a practically sufficient value also in the condition of expression (9), there is no problem in this respect.

This is a reason why the upper limit of the epitaxial film thickness L is defined as in expression (1).

Regarding influences of the impurity density of the epitaxial film, it is recognized from FIGS. 4 through 12 that $F_T$ increases with decrease of the impurity density within the range of the epitaxial film thickness defined by expression (1). However, regarding the dynamic range, it is recognized from FIG. 5 that the dynamic range decreases with decrease of the impurity density. When $N < 1 \times 10^{13} cm^{-3}$, the dynamic range becomes 30 dB approximately which is sufficient practically.

On the other hand, $F_T$ drops with increase of N, and becomes about $-60$ dBm or less when $N > 1 \times 10^{16} cm^{-3}$. This value is too low in view of a nature of an arrangement of piezoelectric film/semiconductor which is expected to exhibit a high $F_T$. Therefore, the impurity density is preferably selected in the following range:

$$1 \times 10^{13} cm^{-3} \leq N \leq 1 \times 10^{16} cm^{-3}$$

This is a reason why the impurity density is defined as in expression (4).

The aforegoing description explained conditions (A) and (B) of the epitaxial film in the present invention.

Next, the basic concept of the invention is used in a SAW convolver having a further arrangement including an epitaxial semiconductive substrate. Conditions of the epitaxial film in this case are described below.

Figure 13:
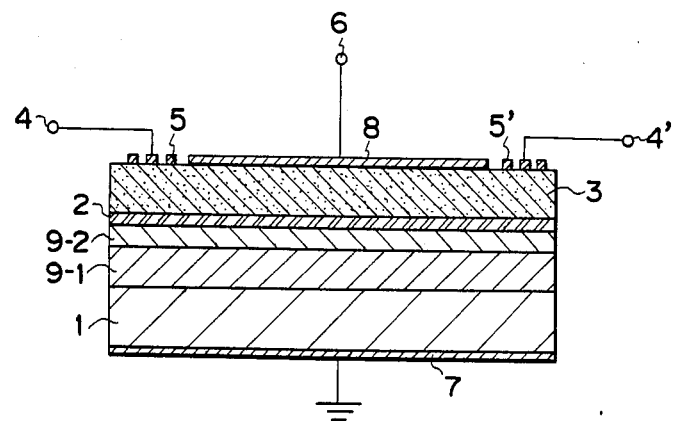
FIG. 13 is a cross-sectional view of a monolithic SAW convolver according to a further embodiment of the invention.
Figure 14:
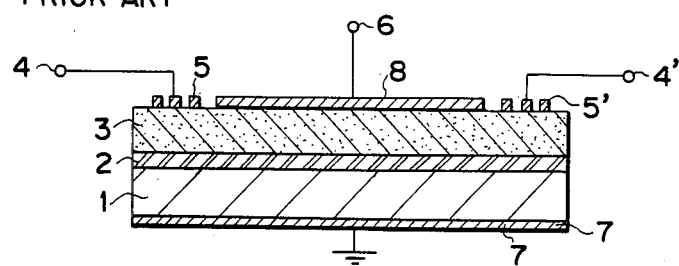
FIGS. 14 and 15 are cross-sectional views of two different prior art monolithic convolvers.
Figure 15:
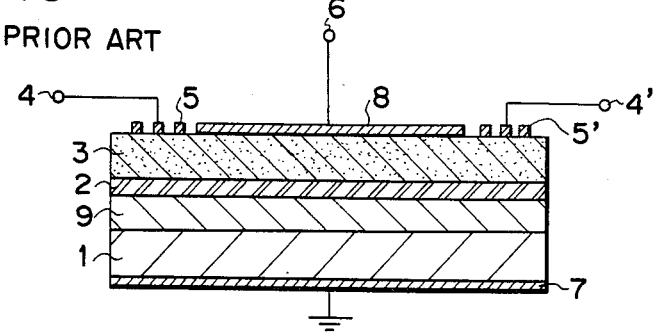

As described above, conditions (A) and (B) define conditions of the epitaxial film thickness in a convolver having the arrangement of FIG. 15. The convolver of FIG. 15 can be further developed to a convolver having the arrangement of FIG. 13. The present inventors already found that the arrangement of FIG. 13 is a convolver operable under no bias voltage (Japanese Patent Appln. No. 60-202845 entitled "Surface Acoustic Wave Device" filed on Sept. 13, 1985, and that the arrangement is significantly useful in practical use.

Here, the semiconductive epitaxial film consists of a first semiconductive epitaxial film 9-1 and a second semiconductive epitaxial film 9-2. The first semiconductive epitaxial film 9-1 is a semiconductor of the same type as that of the high-concentrated semiconductive substrate 1 whereas the second semiconductive epitaxial film 9-2 is a semiconductor of the opposite conduction type. When the first semiconductive epitaxial film 9-1 is of n-type, the second semiconductive epitaxial film 9-2 is of p-type. In contrast, when the first semiconductive epitaxial film 9-1 is of p-type, the second semiconductive epitaxial film 9-2 is of n-type. A difference from the arrangement of FIG. 15 is that the second semiconductive epitaxial film 9-2 of a different conduction type is provided in the epitaxial film. In most cases, the second semiconductive epitaxial film 9-2 is formed by ion injection, and the thickness at the portion is selected at a value considerably smaller than the thickness of the first semiconductive epitaxial film 9-1. Further, the impurity density and thickness of the second semiconductive epitaxial film are selected at a value to cause depletion of the entire portion of the second semiconductive epitaxial film 9-2 when bias application to the gate electrode 8 is zero. It is intended that the arrangement exhibits the best operation at zero bias voltage. Therefore, it may be considered that during operation of the convolver, the depletion end is positioned in the first semiconductive epitaxial film 9-1.

As described above, $F_T$ is mainly determined by nonlinear constant $\gamma_2$ and propagation loss $\alpha$, and particularly, influences of the epitaxial film thickness are reflected by propagation loss $\alpha$. On the other hand, during operation of the convolver having the arrangement of FIG. 13, the depletion end is positioned in the first semiconductive epitaxial film 9-1 as described above. Non-linear constant $\gamma_2$ is determined by impurity density N at the position of the depletion end, and is expressed by expression (6). Further, the SAW propagation loss is mainly determined by the interior energy loss in the semiconductor beyond the depletion end (in the depletion region or in the weak-converted region). Therefore, considering the aforegoing factors, it may be considered that $F_T$ is mainly determined by the first semiconductive epitaxial film 9-1 also in the arrangement of FIG. 13, and that the dependency of $F_T$ on the epitaxial film thickness is also determined by the impurity density of the first semiconductive epitaxial film 9-1 and by the relationship between the position of the depletion end therein and the epitaxial film thickness.

Therefore, it is reasonable to define conditions of the epitaxial film thickness relative to the maximum depletion width by the same expression (1) as that for the arrangement of FIG. 15.

It should be noted, however, that maximum depletion width in the arrangement of FIG. 13 is expressed by an expression different from expression (2) because the second semiconductive epitaxial film 9-2 exists unlike the arrangement of FIG. 15. When the second semiconductive epitaxial film 9-2 has thickness $l_2$, $W_{max}$ is in the following range:

$$l_2 < W_{max} \leq l_2 + W_m \qquad (10)$$

where $W_m$ is the maximum depletion width exhibited when the first semiconductive epitaxial film 9-1 alone exists, and is expressed by:

$$W_{max} = \sqrt{\frac{4\epsilon_s kT\ln(N_1/n_1)}{e^2 N_1}} \qquad (11)$$

where $N_1$ is the impurity density of the first semiconductive epitaxial film 9-1, and other parameters are identical to those of expression (2).

Therefore, it is reasonable to define conditions of the epitaxial film thickness in the arrangement of FIG. 13 as follows.

(C) Thickness L of the epitaxial film in the arrangement of FIG. 13 is defined as follows:

$$l_2 < L \leq l_2 + W_m + 2 \ \mu m \qquad (12)$$

where $l_2$ is the thickness of the second semiconductive epitaxial film 9-2, and $W_m$ is determined by expression (11).

Further, since $F_T$ in the arrangement of FIG. 13 is mainly determined by the first semiconductive epitaxial film 9-1, it is reasonable to define conditions of the impurity density of the epitaxial film in the same manner as expression (4) as follows.

(D) When Si is used as the conductor in the arrangement of FIG. 13, thickness L of the epitaxial film is selected to satisfy expression (12), and impurity density $N_1$ of the first semiconductive epitaxial film 9-1 is selected in the following range:

$$1 \times 10^{13} cm^{-3} \leq N_1 \leq 1 \times 10^{16} cm^{-3} \qquad (13)$$

The aforegoing conditions (A), (B), (C) and (D) are provided for arrangements of FIGS. 15 and 13. However, among FIGS. 15 and 13, an arrangement not including the insulator 2 is possible. Since the insulator 2 is very thin in most cases, no large changes occur in the SAW propagation mode nor in potential leakage into the semiconductor in absence of the insulator 2. Therefore, the use of conditions (A), (B), (C) and (D) is significantly useful also in absence of the insulator 2 in the arrangements of FIGS. 15 and 13.

As described above, the invention provides a monolithic SAW convolver having a good efficiency and a good temperature property.

The invention convolver can be used not only in all devices using a SAW convolver but also in other devices such as correlator, SSC communication apparatus, radar, video processing apparatus, Fourier transformer, etc.

What is claimed is:

1. In a monolithic surface acoustic wave convolver having an arrangement of piezoelectric film/insulator/semiconductive epitaxial film/high-concentrated semiconductive substrate, an improvement wherein said semiconductive epitaxial film has thickness L in the following range:

$$W_{max} < L \leq W_{max} + 2 \ \mu m$$

where Wmax is the maximum depletion width defined by:

$$W_{max} = \sqrt{\frac{4\epsilon_s kT\ln(N/n_1)}{e^2 N}}$$

where N is the impurity density of said epitaxial film, ni is the intrinsic carrier density of said epitaxial film, $\epsilon_s$ is the dielectric constant of said epitaxial film, k is the Boltsmann's constant, e is electron charges; and T is the absolute temperature.

2. A surface acoustic wave convolver of claim 1 wherein said semiconductor is silicon (Si), and impurity density N of said epitaxial film is in the following range:

$$1 \times 10^{13} cm^{-3} \leq N \leq 1 \times 10^{16} cm^{-3}$$

3. A surface acoustic wave convolver of claim 1 wherein said semiconductor is GaAs.

4. A surface acoustic wave device of claim 1 wherein said insulator is $SiO_2$.

5. A surface acoustic wave convolver of claim 1 wherein said piezoelectric film is made from ZnO.

6. A surface acoustic wave convolver of claim 1 wherein said piezoelectric film is made from AlN.

7. A surface acoustic wave convolver of claim 2 wherein the propagation mode of surface acoustic waves is Sezawa wave.

8. A surface acoustic wave convolver of claim 7 wherein the surface orientation of said Si is (110), and the propagation direction of a surface acoustic wave is [100].

9. A surface acoustic wave convolver of claim 7 wherein the surface orientation of said Si is (100), and the propagation direction of a surface acoustic wave is [110].

10. In a monolithic surface acoustic wave convolver having an arrangement of piezoelectric film/insulator/second semiconductive layer/first semiconductive layer/high-concentrated semiconductive substrate, an improvement wherein said second and first semiconductive layers are semiconductive epitaxial films which are opposite to each other in conduction type, and wherein thickness L of said semiconductive epitaxial film is in the following range:

$$l_2 < L \leq l_2 + W_m + 2 \ \mu m$$

where $l_2$ is the thickness of said second semiconductive layer, and $W_m$ is expressed by:

$$W_m = \sqrt{\frac{4\epsilon_s kT\ln(N_1/n_1)}{e^2 N_1}}$$

where $N_1$ is the impurity density of said first semiconductive layer, ni is the intrinsic carrier density of said first semiconductive layer, $\epsilon_s$ is the dielectric constant of said first semiconductive layer, k is the Boltsmann's constant, e is the magnitude of electron charges, and T is the absolute temperature.

11. A surface acoustic wave convolver of claim 10 wherein said semiconductor is silicon (Si), and impurity density $N_1$ of said epitaxial film is in the following range:

$$1 \times 10^{13} cm^{-3} \leq N_1 \leq 1 \times 10^{16} cm^{-3}$$

12. A surface acoustic wave convolver of claim 10 wherein said semiconductor is GaAs.

13. A surface acoustic wave convolver of claim 10 wherein said insulator is $SiO_2$.

14. A surface acoustic wave convolver of claim 10 wherein said piezoelectric film is ZnO.

15. A surface acoustic wave convolver of claim 10 wherein said piezoelectric film is AlN.

16. A surface acoustic wave convolver of claim 11 wherein the propagation mode of surface acoustic waves is Sezawa wave.

17. A surface acoustic wave convolver of claim 16 wherein the surface orientation of said Si is (110), and the propagation direction of a surface acoustic wave is [100].

18. A surface acoustic wave convolver of claim 16 wherein the surface orientation of said Si is (I00), and the propagation direction of a surface acoustic wave is [110].

* * * * *